(12) United States Patent
Blouin

(10) Patent No.: US 7,816,933 B2
(45) Date of Patent: Oct. 19, 2010

(54) SEMI-GENERIC IN-CIRCUIT TEST FIXTURE

(76) Inventor: Martin Blouin, 585, rue Guy Apt. No. 7, Montreal, Quebec (CA) H3J 2V5

( * ) Notice: Subject to any disclaimer, the term of this patent is extended or adjusted under 35 U.S.C. 154(b) by 0 days.

(21) Appl. No.: 12/168,397

(22) Filed: Jul. 7, 2008

(65) Prior Publication Data

US 2009/0015284 A1    Jan. 15, 2009

(30) Foreign Application Priority Data

Jul. 13, 2007   (CA) .................................. 2592901

(51) Int. Cl.
*G01R 31/02* (2006.01)
(52) U.S. Cl. .................. 324/755; 324/754; 324/758
(58) Field of Classification Search .......... 324/754–765
See application file for complete search history.

(56) References Cited

U.S. PATENT DOCUMENTS

| | | | | |
|---|---|---|---|---|
| 5,270,641 A | * | 12/1993 | Van Loan et al. | 324/757 |
| 5,436,567 A | * | 7/1995 | Wexler et al. | 324/754 |
| 5,555,422 A | * | 9/1996 | Nakano | 324/754 |
| 5,663,655 A | * | 9/1997 | Johnston et al. | 324/761 |
| 5,781,021 A | | 7/1998 | Ilani | |
| 5,806,181 A | * | 9/1998 | Khandros et al. | 29/874 |
| 5,818,248 A | * | 10/1998 | St. Onge | 324/761 |
| 6,066,957 A | * | 5/2000 | Van Loan et al. | 324/758 |
| 6,130,547 A | * | 10/2000 | Kato | 324/761 |
| 6,292,004 B1 | | 9/2001 | Kocher | |
| 6,469,531 B1 | | 10/2002 | Sayre et al. | |
| 6,515,496 B2 | * | 2/2003 | Felici et al. | 324/754 |
| 6,661,245 B1 | | 12/2003 | Reis et al. | |
| 6,784,675 B2 | * | 8/2004 | Willard | 324/754 |
| 6,794,889 B2 | * | 9/2004 | Jafari et al. | 324/758 |
| 6,971,045 B1 | * | 11/2005 | Deb et al. | 714/30 |
| 7,071,717 B2 | | 7/2006 | Hoke et al. | |
| 7,088,118 B2 | * | 8/2006 | Liu et al. | 324/754 |
| 2004/0036493 A1 | * | 2/2004 | Miller | 324/762 |
| 2006/0158203 A1 | * | 7/2006 | Volkerink et al. | 324/754 |

* cited by examiner

*Primary Examiner*—Ha Tran T Nguyen
*Assistant Examiner*—Richard Isla Rodas
(74) *Attorney, Agent, or Firm*—Brouillette & Partners; Robert Brouillette; Francois Cartier

(57) ABSTRACT

A semi-generic test fixture for testing printed circuit boards (PCBs) and/or for testing printed circuit boards assemblies (PCBAs) is presented. The semi-generic test fixture implements a combination of generic and customized parts for tester-to-fixture interface instead of a static dedicated in-circuit test (ICT) fixture which is able to interconnect only one kind of unit under test (UUT) to an ICT tester test-head. The semi-generic ICT fixture (SGICTF) is able to interconnect an ICT test-head with a variety of UUT types with a minimum of adaptation. Accordingly, the SGICTF generally comprises two generic PCB connected to the tester and two customized PCB connected to the generic PCB and adapted to interface the particular UUT via testing probes.

4 Claims, 5 Drawing Sheets

SEMI-GENERIC IN-CIRCUIT TEST FIXTURE

CROSS-REFERENCE TO RELATED APPLICATIONS

The present patent application claims the benefits of priority of commonly assigned Canadian Patent Application No. 2,592,901, entitled "Semi-Generic In-Circuit Test Fixture" and filed at the Canadian Intellectual Property Office on Jul. 13, 2007.

FIELD OF THE INVENTION

The present invention generally relates to the field of in-circuit testing fixtures for testing printed circuit board assemblies (hereinafter "PCBA" or "PCBAs") and printed circuit boards (hereinafter "PCB" or "PCBs"). Generally speaking, the testing procedure may be categorized into printed circuit loaded-board testing and printed circuit bare-board testing.

BACKGROUND OF THE INVENTION

Printed circuit board assemblies (PCBAs) and printed circuit boards (PCBs) are generally tested after being manufactured in order to detect any manufacturing defaults. Generally speaking, PCB testing may be categorized as bare-board testing whereas PCBA testing may be categorized as loaded-board testing. During bare-board testing, a bare PCB, without any components and/or devices attached thereto, is tested to verify the continuity of the traces between the pads and/or the vias on the board. During loaded-board testing, a PCBA with some or all of the electrical components and/or devices mounted thereto is tested in order to verify that all the required electrical connections have been properly completed. Additionally, loaded-board testing may also include integrated circuits (hereinafter "IC" or "ICs") testing to verify that the components mounted on the PCB perform within specifications.

Previously, PCBAs were generally designed and manufactured such that their electrical contacts, used as test points, were arranged in a regularly spaced pattern or matrix. During testing, the PCBA was placed directly atop of a regularly spaced pattern of interface or testing probes located in a tester. However, as the geometry of PCBAs and electronic components shrunk, PCBAs contact pads could no longer be placed in a regularly spaced pattern and therefore, could no longer be probed directly by regularly spaced interface probes. Consequently, a bare-board fixture was developed which utilized long, leaning solid probes to provide electrical connections between the small, closely spaced, randomly located targets on the PCB and the regularly spaced interface probes located in the tester (see for example U.S. Pat. No. 6,469,531).

A bare-board tester probes testpads, vias, and plated through-holes on bare printed circuit boards only and tests for electrical connectivity and continuity between various test points in the circuits on the printed circuit boards before any components are mounted on the board. A typical bare-board tester contains test electronics with a large number of switches that connect test probes to corresponding test circuits in the electronic test analyzer.

Typical measurements conducted by bare-board testers include shorts, opens and impedance or resistance. Most conventional bare-board testers fall into one of two categories, either the "bed of nails" tester (hereinafter "BON tester") or the "flying probe" tester.

On the one hand, the BON tester utilizes a dedicated fixture containing a series of plastic sheets with holes drilled therein to permit the passage of the nails. During testing, the UUT is placed in direct contact with the dedicated fixture. The nails on the fixture connect the various targets (e.g., testpads, vias, traces and through-holes) on the UUT to the internal electronics of the tester. Although the BON tester permits nearly simultaneous testing of all targets on a UUT, each unique UUT that is tested requires a different dedicated fixture.

On the other hand, the "flying probe" tester is a universal tester that does not require a fixture. The "flying probe" tester uses a small number of probes that are sequentially positioned over numerous test points on the UUT. Although the "flying probe" tester permits testing of high resolution UUTs, the serial approach of testing targets on a UUT dramatically reduces the throughput of the tester. Thus, the "flying probe" tester is significantly slower than the BON tester. There is therefore a need for an in-circuit testing equipment which will generally obviates the shortcomings of the prior art systems.

OBJECTS OF THE INVENTION

A primary aspect of the semi-generic in-circuit test fixture (SGICTF) of the present invention is to provide an economical solution compared to the custom fabrication of dedicated ICT test fixtures and which can also generally be more rapidly deployed in production due to the generic parts generally mounted in permanence on the tester.

Another aspect of the present invention is to provide a solution easier to manipulate compared to prior art static ICT test fixture, because the overall weight of the invention is shared in multiple independent pieces.

Yet another aspect of the present invention is to provide a platform to which can be connected more complex electronic features. Without being limitative in nature, the electronic features could comprise programmable memory chips, software downloads, multiplexing capability to reallocate ICT tester resources for more than one test-case, high frequency testing and other features that can be performed by custom electronics inside an electronic fixture.

Other and further objects and advantages of the present invention will be obvious upon an understanding of the illustrative embodiments about to be described or will be indicated in the appended claims, and various advantages not referred to herein will occur to one skilled in the art upon employment of the invention in practice.

SUMMARY OF THE INVENTION

Accordingly, the present invention generally provides a novel semi-generic in-circuit testing fixture (SGICTF) which comprises a generic portion which is reusable for generally every UUT and a customized portion adapted to each particular UUT.

More particularly, the SGICTF of the present invention is adapted to be physically attached to and in electronic communication with an in-circuit tester test-head of generally known configuration. The SGICTF exterior shape is generally similar to well known ICT wireless or wired custom fixtures and is therefore adapted to receive therein the PCB or PCBA to be tested.

According to the preferred embodiment of the present invention, the customized portion of the SGICTF first comprises preferably two custom drilled plates which are used to hold and guide the spring loaded probes that are used to contact the UUT test points during testing. Since the UUT has generally a top side and an under side, one custom drilled plate is generally adapted to be located over the UUT whereas the other custom drilled plate is adapted to be located underneath. Understandably, if only one side of the UUT needs to be tested, the SGICTF may alternatively comprise a single custom drilled plate or may comprise a single custom drilled plate and a blank drilled plate.

Since the custom drilled plates are generally customized for each tested UUT, they are most preferably removable from the SGICTF. Furthermore, though generally provided as single plates, it is to be understood that multiple coplanar drilled plates could be used instead without departing from the invention. Accordingly, the present invention envisages the use of modular drilled plates.

To ensure a good physical and electrical contact between the UUT and the spring loaded probes of the SGICTF, pressure must be applied on the top and bottom drilled plates to force spring loaded probes to be in contact with the UUT. The pressure is generally provided by a vacuum system or a pneumatic system though other systems could be used. The invention is not limited to any particular pressurization or compression system. When the pressure is effectively applied, the UUT is sandwiched between the top and bottom drilled plates.

In order to interface the spring loaded probes associated with each of the custom drilled plates, the SGICTF is further provided with customized yet generally simple PCBs. Understandably, one of the custom PCBs is adapted to interface the spring loaded probes of the top drilled plate whereas the other custom PCB is adapted to interface the spring loaded probes of the bottom drilled plate. Generally, the top custom PCB and the bottom custom PCB are different. Still, if only one drilled plate is used, only one custom PCB will be needed.

In a preferred embodiment of the present invention, the custom PCBs do not contain any active or passive components. Accordingly, the custom PCBs are generally bare single or multi-layers PCBs comprising pads to interface the spring loaded probes, connectors to provide electrical communication with their respectively associated generic PCB (see below) and traces to route the signal between the pads and the connectors.

Therefore, though custom made for each UUT, the skilled addressee will recognize that it is much easier and faster to manufacture PCBs comprising only traces and pads than complete custom test fixtures.

Still according to the preferred embodiment of the present invention, the generic portion of the SGICTF generally comprises two generic PCBs which are preferably further interconnected together by one or more flat cables. One of the two generic PCBs is also further in electronic communication with the ICT test test-head via nails or pins soldered thereto.

As for the custom drilled plates and the custom PCBs, one of the generic PCBs is adapted to be located over the UUT whereas the other generic PCB is adapted to be located underneath. The generic PCBs, which are generally left in permanence on the tester, are further adapted to be in electronic communication with the custom PCBs. Accordingly, the top generic PCB is connectable to the top custom PCB whereas the bottom generic PCB is connectable to the bottom custom PCB. Preferably but not exclusively, the generic PCBs are connected to their respective custom PCB via one or more dense connectors. Still, as explained above, if only one side of the UUT needs to be tested, the generic PCB associated with the blank drilled plate needs not to be connected to the blank "custom" PCB.

According to the invention, as for the custom PCBs, the generic PCBs are generally bare single or multi-layers PCBs comprising connector or connectors to provide connection with each other and with their respective custom PCBs and traces to route the signals travelling between the probes and the tester. Still, the generic PCBs could also contain active and/or passive components if necessary. In any case, it is important that the generic PCBs remain generic enough to interface any custom PCBs.

In use, the test signals are first transmitted to the generic PCBs either via the direct connection of one of them to the tester test-head, via pins for example, or via the flat cable linking both generic PCBs together. Via their respective dense connectors, each generic PCB transmits the test signals to their associated customized PCB which then transmits the test signals to the UUT via the spring loaded probes aligned with pads thereon. The response signals are then transmitted back to the tester via a similar albeit inverted route.

Though not necessarily required, the SGICTF could be further provided with external electronic testing systems, generally but not exclusively connected to the generic PCBs, to provide additional testing functionalities. Furthermore, though not generally required, the SGICTF could be further equipped with a software and/or hardware control system to control custom electronic features.

The features of the present invention which are believed to be novel are set forth with particularity in the appended claims.

BRIEF DESCRIPTION OF THE DRAWINGS

The above and other objects, features and advantages of the invention will become more readily apparent from the following description, reference being made to the accompanying drawings in which.

DETAILED DESCRIPTION OF THE PREFERRED EMBODIMENT

A novel semi-generic in-circuit test fixture will be described hereinafter. Although the invention is described in terms of specific illustrative embodiments, it is to be understood that the embodiments described herein are by way of example only and that the scope of the invention is not intended to be limited thereby.

Figure 1:
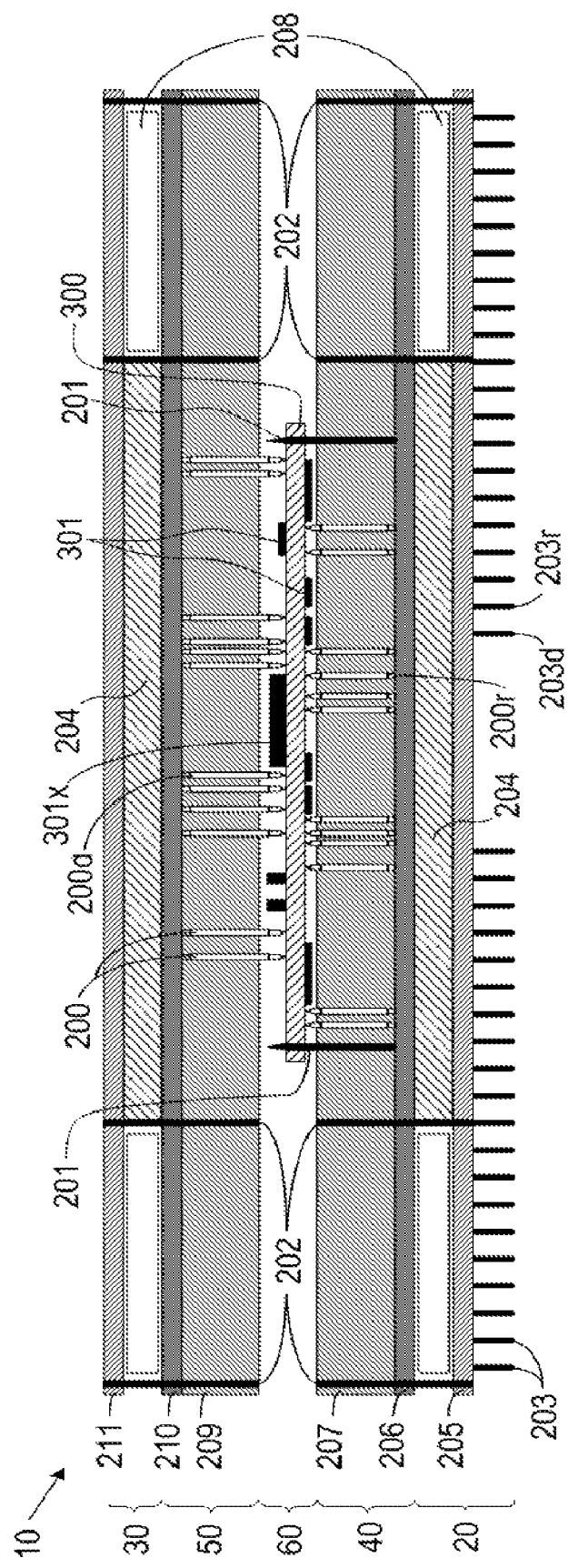
FIG. 1 is schematic front view of an embodiment of the semi-generic ICT fixture (SGICTF) of the present the invention.

Referring first to FIG. 1, a schematic front view of the semi-generic ICT fixture (SGICTF) 10 of the present invention is shown. The SGICTF 10 can be partitioned into several logical layers: the generic interconnection layer 20 between the ICT tester resources and the bottom custom part of the system, the generic interconnection layer 30 between the ICT tester resources and the top custom part of the system, the custom interconnection layer 40 between the generic bottom part of the system and the UUT, the custom interconnection layer 50 between the generic top part of the system and the UUT and finally the UUT layer 60.

Figure 3:
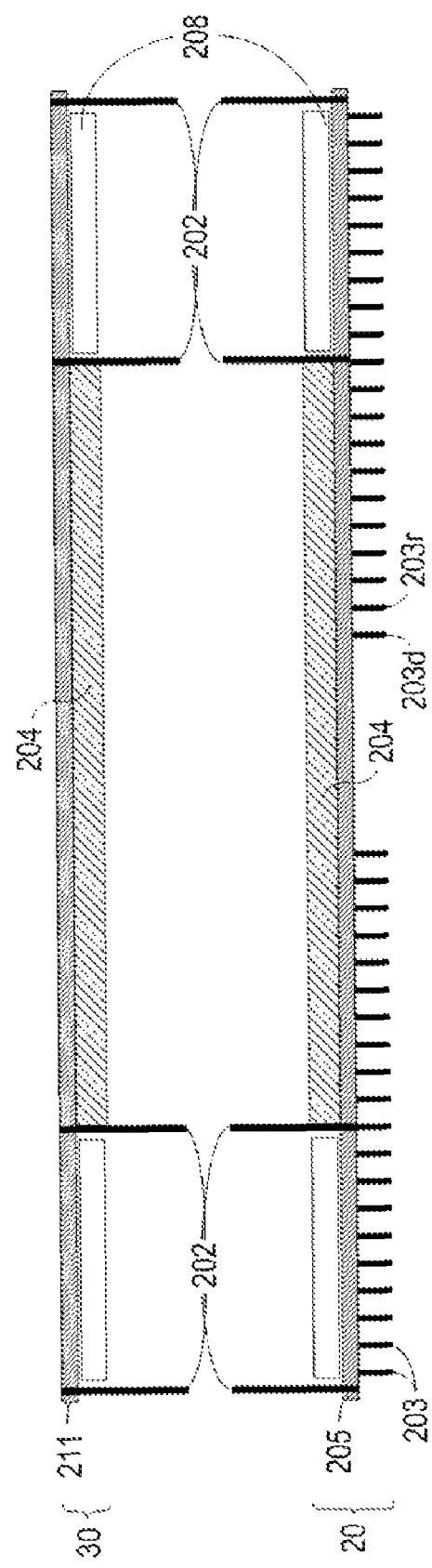
FIG. 3 is a schematic front view of the generic portions of the SGICTF of FIG. 1.

Referring now to FIG. 3, the generic interconnection layer 20 between the ICT tester resources and the bottom custom part of the system and the generic interconnection layer 30 between the ICT tester resources and the top custom part of the system will now be described in more details.

Layer 20 is composed of a first generic fixture to tester interface PCB 205 which is provided with metal nails or pins 203, generally soldered thereto, to connect the ICT tester resources to the SGICTF 10. Understandably, the number of pins 203 shown in FIG. 3 is for example purpose only. The exact number of pins 203 will depend upon the particular ICT tester. The PCB 205 is also equipped with connecting means such as dense connectors 208. Finally, to provide structural integrity and rigidity, stiffener plate 204 and guide pins 202 are provided on the PCB 205. The guide pins 202 are generally used to provide alignment between the generic parts and the custom parts of the SGICTF 10.

In a similar arrangement, layer 30 is composed of a second generic fixture to tester interface PCB 211 which is also provided with a dense connectors 208, stiffener plate 204 and guide pins 202. As shown in FIG. 3, generic PCB 205 and generic PCB 211 are facing each other.

Though both PCB 205 and PCB 211 are generic, it is to be understood that they are not necessary identical and/or interchangeable. Indeed, both PCBs 205 and 211 are generally different due to the fact that they have to route different signals.

Figure 2:
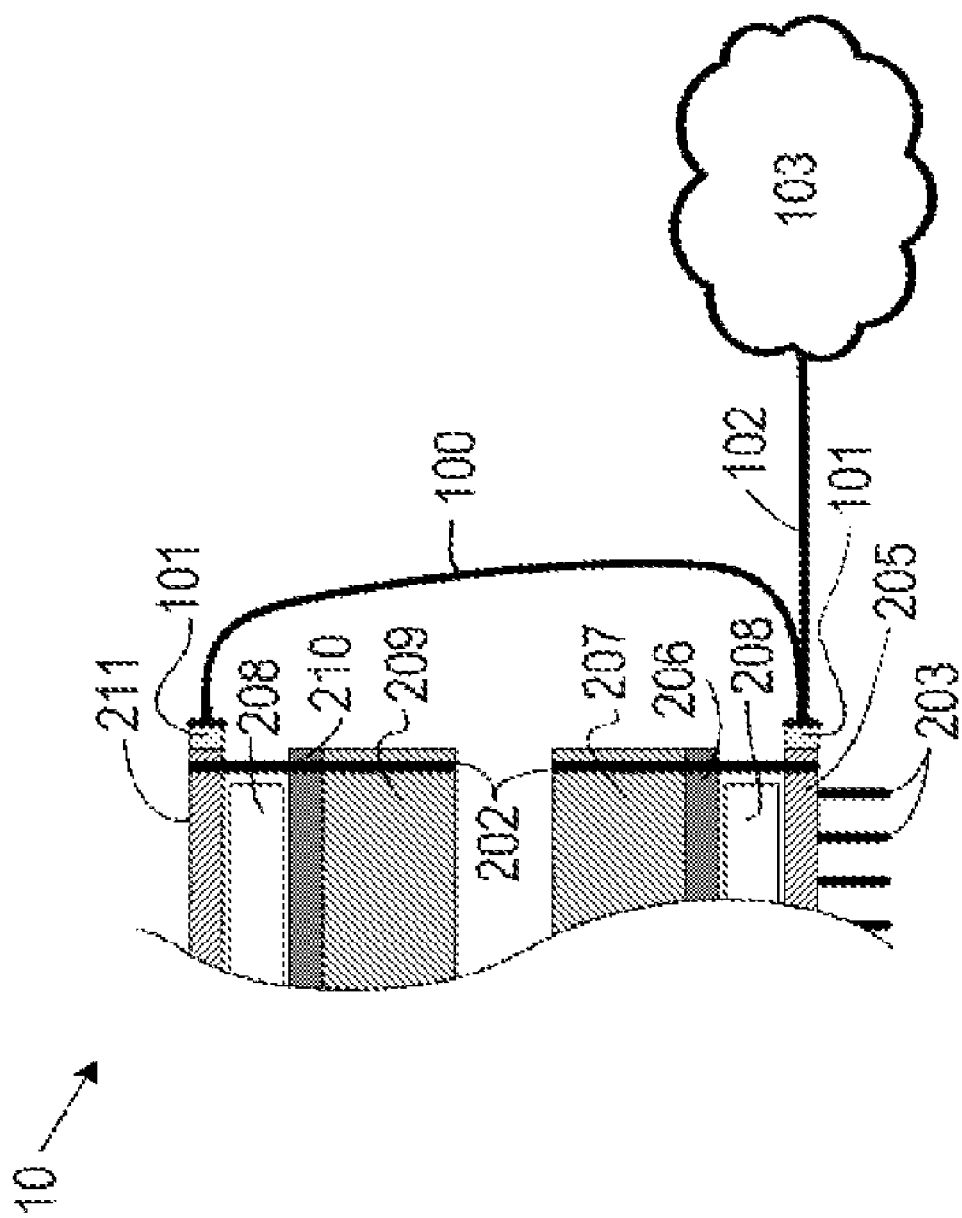
FIG. 2 is a fractional front view of SGICTF of FIG. 1 with flat cables to electrically interconnect the top and bottom portions of the SGICTF to external electronics.

As shown in FIG. 2, electrical communication between the first PCB 205 and the second PCB 211 is generally provided by connectors 101 and flat cables 100 though other connecting arrangements are possible. Additionally, the first or the second generic PCB can be further connected to external electronic testing systems 103 via cable 102. The external electronic testing systems 103 will be described in more details below.

Though not shown in the figures, generic PCBs 205 and 211 are further provided with traces for routing the electronic testing signals. For PCB 205, the traces provide routing of the electronic testing signals between the connector 101, the dense connectors 208 and the pins 203 whereas for PCB 211, the traces provide routing of the electronic testing signals between connector 101 and dense connectors 208. Understandably, the generic PCBs 205 and 211 can be provided either as single layer PCBs or as multiple layers PCBs. The present invention is not so limited.

Though generally not provided with active or passive electronic components, the generic PCBs 205 and 211 may be possibly provided with one or more active or passive electronic components, mounted thereon, for providing additional testing functionalities. In any case, the addition of active or passive electronic components must not affect the generic nature of the generic PCBs 205 and 211.

Figure 4:
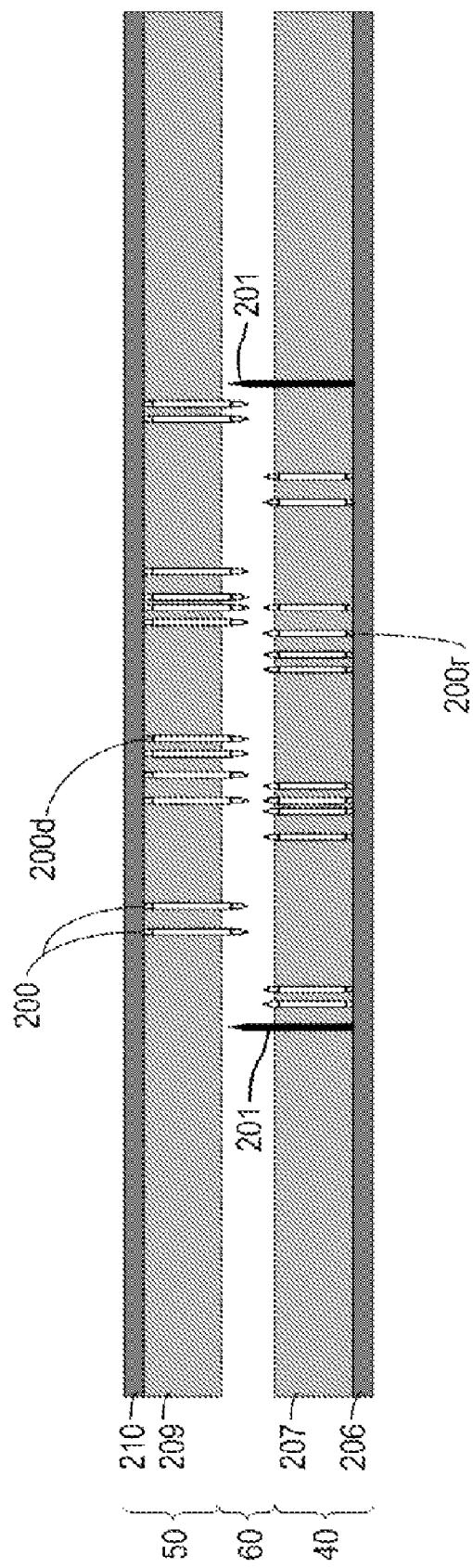
FIG. 4 is a schematic front view of the customized portions of the SGICTF of FIG. 1 that must be adapted to each UUT.

Referring now to FIG. 4, the custom interconnection layer 40 between the generic bottom part of the system and the UUT 300 and the custom interconnection layer 50 between the generic top part of the system and the UUT 300 will now be described in more details.

Layer 40 is composed of a fixture to UUT bottom interface PCB 206 and a probe plate 207. For the sake of simplicity, probe plate 207 is shown as a single plate though in a real test fixture, probe plate 207 could be partitioned in multiple coplanar plates. The invention is not so limited. Generally, the probe plate 207 is provided with a customized array of holes with spring loaded probes 200 mounted therein. The holes, and therefore the spring loaded probes 200, are customized to be aligned with predetermined test points on the under side of the UUT 300.

The interface PCB 206 comprises a plurality of contact pads which are customized to be aligned with the spring loaded probes 200 of the probe plate 207. The custom PCB 206 also generally contains series of contact pads properly placed to interconnect with dense connectors 208 of the generic PCB 205. It is important to note that due to the high quantity of signals involved, the strategy is generally to avoid classical connection scheme implying the mating of male and female connectors. A classical scheme would result in very high insertion and extraction force making the removal of custom PCB 206 from the generic PCB 205 very difficult. The dense connectors 208 can be seen as series of double ended spring loaded probes, where one end of the probe is touching PCB 205 while the other one is touching PCB 206. The custom PCB 206 is also provided with traces for routing the electric signals between the pads and the connector.

To ensure good physical and electrical contacts between the UUT 300, the spring loaded probes 200 of the probe plate 207 and the pads of the custom PCB 206, the custom PCB 206 can be equipped with alignment pins 201.

Similarly to layer 40, layer 50 comprises a fixture to UUT top interface PCB 210 and a probe plate 209. As for probe plate 207, probe plate 209 is shown as a single plate though probe plate 209 could be partitioned in multiple coplanar plates. Also as for probe plate 207, probe plate 209 is provided with a customized array of holes into which are mounted spring loaded probes 200. In the case of probe plate 209, the holes, and therefore the spring loaded probes 200, are customized to be aligned with predetermined test points on the top side of the UUT 300.

Of a construction similar to interface PCB 206, the interface PCB 210 comprises a plurality of contact pads which are customized to be aligned with the spring loaded probes 200 of the probe plate 209. As for interface PCB 206, the custom PCB 210 also generally contains series of contact pads properly placed to interconnect with dense connectors 208 of the top generic PCB 211. It is important to note that due to the high quantity of signals involved, the strategy is generally to avoid classical connection scheme implying the mating of male and female connectors. A classical scheme would result to very high insertion and extraction force making the removal of custom PCB 210 from the top generic PCB 211 very difficult. The dense connectors 208 can be seen as series of double ended spring loaded probes, where one end of the probe is touching PCB 210 while the other one is touching PCB 211. The custom PCB 210 is also provided with traces for routing the electric signals between the pads and the connector.

Though described as separated components, bottom interface PCB 206 and probe plate 207 are generally tightly attached together with screws (not shown). Similarly, top interface PCB 210 and probe plate 209 are also generally tightly attached together with screws. Also, due to their customized nature, bottom interface PCB 206, probe plate 207, top interface PCB 210 and probe plate 209 are most preferably removable from the SGICTF 10.

Understandably, if only one side of the UUT 300 needs to be tested, the bottom interface PCB 206 or the top interface PCB 210 would not be needed and could be replaced by a blank PCB. Furthermore, if no points are to be tested on the top side of the UUT 300, the spring loaded 200 and the top probe plate 209 are not needed and could possibly be removed. Additionally, if no points are to be tested on the top side of the UUT 300, the connectors 101 of the generic PCBs 205 and 211 do not need to be connected since no electrical signals are to be sent to the top generic PCB 211.

Preferably, to ensure good electrical contacts between the SGICTF 10 and the UUT 300 and to avoid coplanarity problems, pressure fingers (not shown) generally aligned with UUT 300 empty spaces must be placed on top of probe plates 207 and 209.

Figure 5:
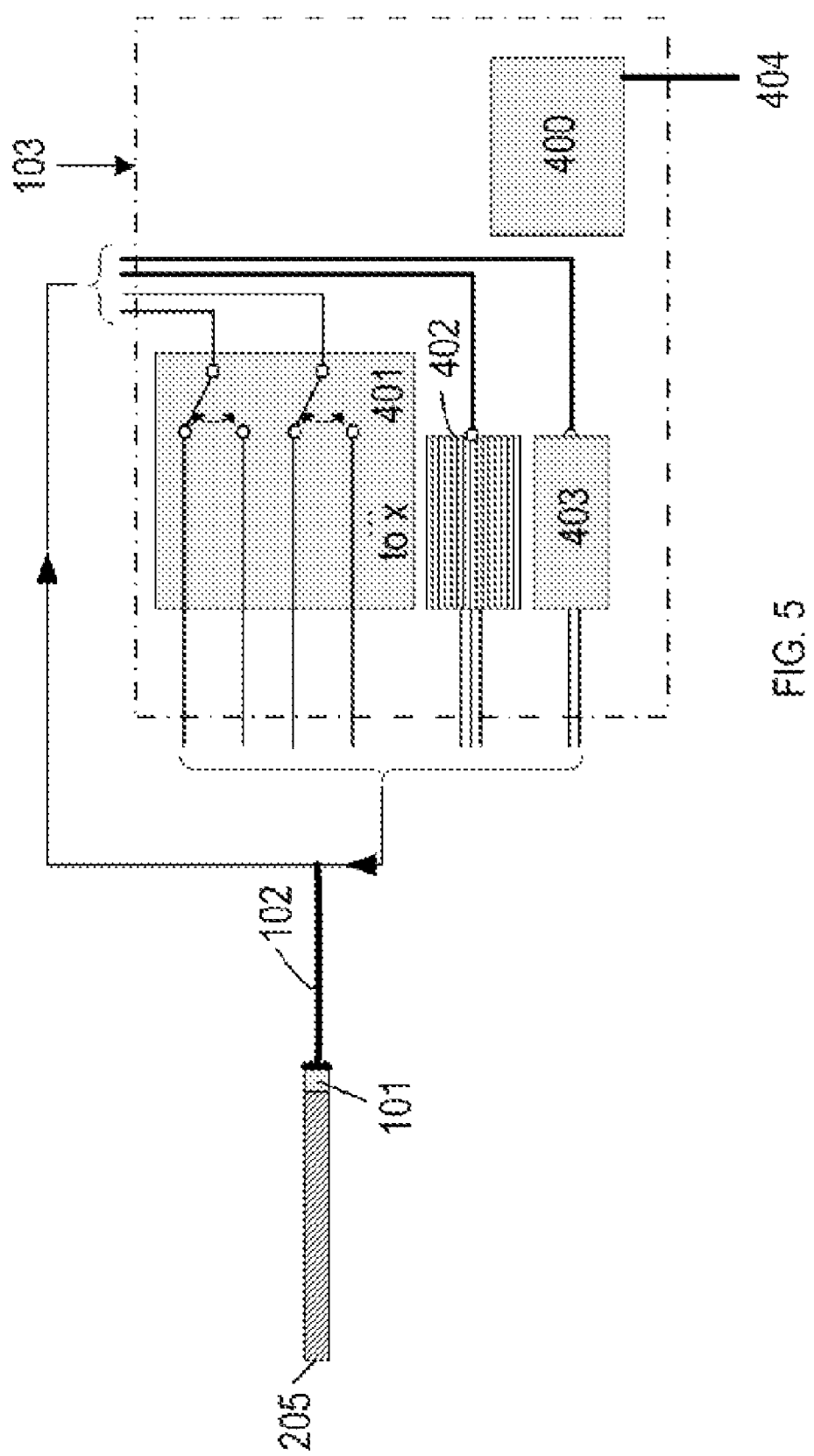
FIG. 5 is detailed schematic view of the external electronics.

As mentioned above, the SGICTF 10 of the present invention can advantageously be connected to external electronic testing systems 103 to perform extra functionalities not efficiently or feasibly available from the ICT tester basic functionalities. Without being limitative in nature, the extra functionalities could comprise functional testing, frequency testing, programming of on-board integrated circuit such as but not limited to FLASHs, FPGAs (i.e. Field Programmable Gate Array) and CPLDs (i.e. Complex Programmable Logic Device), additional switching and/or multiplexing, etc. As shown in FIG. 5, the external electronic testing systems 103 could comprise a multiplexer 401, memory storage 402, frequency testing components 403, hardware controller 400, input/output connection between the external systems 103 and the ICT tester, etc.

Preferably, the external electronic testing systems 103 comprise at least the multiplexer 401 for providing the ability to multiplex ICT tester resources. Multiplexing inside the generic parts will push the testing limits of an ICT tester from n to n+x wherein "n" is the resource number of the ICT tester and "x" is the multiplexing capability of the invention.

Referring now to FIG. 1, an example of the propagation of an electrical signal inside SGICTF 10 for a particular test will be described.

A testing signal is generated by the ICT tester to test a particular component on the UUT 300. It this example, the targeted component $301_x$ must be driven by a test point accessible from the UUT 300 top side wherein the resulting component action or responsive signal must be measured on a test point accessible from the UUT under side.

At first glance, the skilled addressee will figure that the ICT tester driving resource must be connected via an appropriate electrical path to the particular probe 200 which will contact the component $301_x$ driven test point. Furthermore, the skilled addressee will also figure that the ICT tester receiving resource must be connected via an appropriate electrical path to the particular probe 200 which will contact the component $301_x$ responsive test point. Generally, when the targeted component $301_x$ is stimulated by the ICT tester driving resource, the ICT tester receiving resource will measure almost simultaneously the resulting action or responsive signal.

In more details, in this example, the ICT tester driving signal will first pass through a particular nail or pin $203_d$, soldered on the fixture to tester interface PCB 205. The signal will then be routed inside the fixture to tester interface PCB 205 by a unique trace to the connector 101. Thereafter, the signal will go through the flat cable 100, interconnected with the connector 101 on the fixture top side to reach the fixture top generic interface PCB 211. The driving signal will then go from the connector 101 of the top generic interface PCB 211 to a dense connector 208 via a unique trace. Via the dense connector 208, the driving signal will cross to the fixture to UUT top interface PCB 210 and then, via a unique trace, to the pad aligned with the probe $200_d$. As mentioned above, the fixture to UUT top interface PCB 210 is designed especially to have its outside pads aligned with the probes 200 and therefore one of the pads is directly aligned with probe $200_d$ which in contact with a test point on the UUT 300. With this closed circuit, the ICT tester driving signal can travel from nail $203_d$ to probe $200_d$ and thus from the ICT tester to the test point on the UUT 300.

Once the ICT tester drives the signal for a particular test, the ICT tester will look for the responsive signal on another one of the pins 203. In the present example, the ICT tester will wait for a response on pin $203_r$. Pin $203_r$ is interconnected in closed circuit with probe $200_r$ facing the UUT 300 test point located on the under side thereof. In order to get a closed circuit between pin $203_r$ and probe $200_r$, probe $200_r$ contacts a pad on the fixture to UUT bottom interface PCB 206, the pad being connected to a dense connector 208 via a unique trace. The responsive signal will then cross to the fixture to tester interface PCB 205 via the dense connector 208. Finally, the responsive signal will reach the pin $203_r$ via a unique trace.

Understandably, the preceding example is only illustrative. Accordingly, the route taken by each driving and responsive signals can vary according to the location of the test points on the UUT 300. In any case, each component of the UUT 300 who needs to be tested will be tested in manner similar to the one presented above. Also, the component type will generally determine how many driving signals and responsive signals will be involved to test a particular component.

While illustrative and presently preferred embodiments of the invention have been described in detail hereinabove, it is to be understood that the inventive concepts may be otherwise variously embodied and employed and that the appended claims are intended to be construed to include such variations except insofar as limited by the prior art.

The invention claimed is:

1. An in-circuit test fixture for providing an electronic interface between an in-circuit tester and a unit under test, said unit under test having a top side and an under side, said fixture comprising:
    a. a first generic printed circuit board having a first configuration, said first generic printed circuit board comprising a plurality of pins operatively connectable to said tester for receiving test signals therefrom and for transmitting response signals thereto, a first connector and a second connector, said first generic printed circuit board being configured for routing each of said test signals and response signals between said plurality of pins, said first connector and said second connector, wherein said first configuration is independent from said unit under test;
    b. a second generic printed circuit board having a second configuration, said second generic printed circuit board comprising a third connector and a fourth connector, said fourth connector being operatively connectable to said second connector for receiving test signals from said first generic printed circuit board and for transmitting response signals to said first generic printed circuit board, said second generic printed circuit board being configured for routing each of said test signals and response signals between said third connector and said fourth connector, wherein said second configuration is independent from said unit under test;
    c. a first customized printed circuit board having a third configuration, said first customized printed circuit board comprising a fifth connector operatively connectable to said first connector for receiving test signals from said first generic printed circuit board and for transmitting response signals to said first generic printed circuit board, and a first plurality of pads, said first customized printed circuit board being configured for routing said test signals and said response signals between said fifth connector and said first plurality of pads, wherein said third configuration is dependent on said unit under test;
    d. a second customized printed circuit board having a fourth configuration, said second customized printed circuit board comprising a sixth connector operatively connectable to said third connector for receiving test signals from said second generic printed circuit board and for transmitting response signals to said second generic printed circuit board, and a second plurality of pads, said second customized printed circuit board being configured for routing said test signals and said response signals between said sixth connector and said second plurality of pads, wherein said fourth configuration is dependent on said unit under test;

e. a first customized probe plate provided with a plurality of holes for holding and guiding a first plurality of probes, said first plurality of probes being configured to contact first predetermined points on one of said top and under sides of said unit under test and being aligned with said first plurality of pads of said first customized printed circuit board for operatively connecting said first plurality of pads to said first predetermined points;

f. a second customized probe plate provided with a plurality of holes for holding and guiding a second plurality of probes, said second plurality of probes being configured to contact second predetermined points on the other of said top and under sides of said unit under test and being aligned with said second plurality of pads of said second customized printed circuit board for operatively connecting said second plurality of pads to said second predetermined points;

wherein a portion of said test signals and response signals travels at least through both first generic and first customized printed circuit boards when said fixture is used and a remaining portion of said test signals and response signals travels at least through both second generic and second customized printed circuit boards when said fixture is used.

2. An in-circuit test fixture as claimed in claim 1, wherein said first and fifth connectors are dense connectors and wherein said third and sixth connectors are dense connectors.

3. An in-circuit test fixture as claimed in claim 1, wherein said second and fourth connectors are flat cable connectors.

4. An in-circuit test fixture as claimed in claim 1, wherein said test fixture further comprises multiplexing means having a multiplexing capacity of "x", wherein said tester has "n" resources and whereby said test fixture has an testing capacity of "n+x".

* * * * *